(12) United States Patent
Earle et al.

(10) Patent No.: US 9,355,697 B2
(45) Date of Patent: May 31, 2016

(54) WORDLINE DRIVER

(71) Applicant: TAIWAN SEMICONDUCTOR MANUFACTURING COMPANY, LTD., Hsinchu (TW)

(72) Inventors: Adrian Earle, Kanata (CA); Atul Katoch, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 177 days.

(21) Appl. No.: 13/646,497

(22) Filed: Oct. 5, 2012

(65) Prior Publication Data

US 2013/0170313 A1    Jul. 4, 2013

Related U.S. Application Data

(60) Provisional application No. 61/581,013, filed on Dec. 28, 2011.

(51) Int. Cl.
*G11C 8/08* (2006.01)

(52) U.S. Cl.
CPC ........................................ *G11C 8/08* (2013.01)

(58) Field of Classification Search
CPC ... G11C 8/08; G11C 11/4085; G11C 11/4082
USPC ........................................ 365/189.11, 230.06
See application file for complete search history.

(56) References Cited

U.S. PATENT DOCUMENTS

| | | | | |
|---|---|---|---|---|
| 5,412,331 | A * | 5/1995 | Jun et al. | 326/105 |
| 6,088,286 | A * | 7/2000 | Yamauchi et al. | 365/230.06 |
| 6,104,665 | A * | 8/2000 | Hung et al. | 365/230.06 |
| 6,236,613 | B1 * | 5/2001 | Ooishi | 365/226 |
| 6,282,146 | B1 * | 8/2001 | Guo et al. | 365/230.06 |
| 6,434,073 | B2 * | 8/2002 | Guliani et al. | 365/210.1 |
| 6,545,923 | B2 * | 4/2003 | Sim et al. | 365/204 |
| 7,697,357 | B2 * | 4/2010 | Tomishima | 365/203 |
| 7,978,562 | B2 * | 7/2011 | Yabe et al. | 365/230.06 |
| 2004/0042321 | A1 * | 3/2004 | Kirsch et al. | 365/230.06 |
| 2010/0054032 | A1 * | 3/2010 | De Sandre | 365/163 |
| 2010/0061175 | A1 * | 3/2010 | Kim | 365/226 |
| 2010/0157716 | A1 * | 6/2010 | Lee | 365/230.06 |
| 2010/0302880 | A1 * | 12/2010 | Wang et al. | 365/189.11 |
| 2011/0199837 | A1 * | 8/2011 | Reohr et al. | 365/189.06 |

* cited by examiner

*Primary Examiner* — Douglas King
(74) *Attorney, Agent, or Firm* — Hauptman Ham, LLP (57) ABSTRACT

A circuit includes a first transistor and a second transistor of a first type. The circuit further includes a first transistor of a second type. A first first-type drain is coupled to a second first-type source. A first first-type source is configured to have a first voltage value. A first first-type gate is configured to have a first control signal. A second first-type drain is configured to serve as a wordline. A second first-type gate is configured to have a second voltage value. A first second-type source is configured to have a third voltage value. A first second-type gate is configured to have a second control signal. The first transistor and the second transistor of the first type are configured to provide the first voltage value for the wordline. The first transistor of the second-type is configured to provide the third voltage value the wordline.

20 Claims, 6 Drawing Sheets

WORDLINE DRIVER

CROSS-REFERENCE TO RELATED APPLICATION

The present application claims priority of U.S. Provisional Patent Application No. 61/581,013, filed on Dec. 28, 2011, which is incorporated herein by reference in its entirety.

FIELD

The present disclosure is related to a wordline driver.

BACKGROUND

In some existing approaches related to embedded random access memory (eDRAM), the wordline drivers used in the eDRAM provide a signal switching between a first voltage value and a second voltage value in which the first voltage value is higher than an operational voltage value and the second voltage value is lower than a reference or ground voltage value. The first voltage value, the second voltage value, the operational voltage value, and the reference voltage value are commonly called voltages VPP, VBB, VDD, and VSS, respectively. Compared with transistors having a regular oxide layer, transistors having a thicker oxide layer are called thick-oxide transistors, and are used to handle the electrical stress caused by the high voltage swing between voltage VPP and voltage VBB. For an equivalent drive strength, however, the thick-oxide transistors require a layout area larger than that of regular or thin-oxide transistors.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. Compared with another approach, the layout area, the power consumption, and the cost for producing the wordline drivers of various embodiments of the present disclosure are reduced. The cost reduction results from using fewer masks in making the wordline drivers and from reducing the layout area of the wordline drivers. In some embodiments, the wordline drivers are implemented using cascoded thin-oxide transistors that have an oxide layer thinner than a regular oxide layer of a regular transistor.

Exemplary Driver Decoder Circuit

Figure 1:
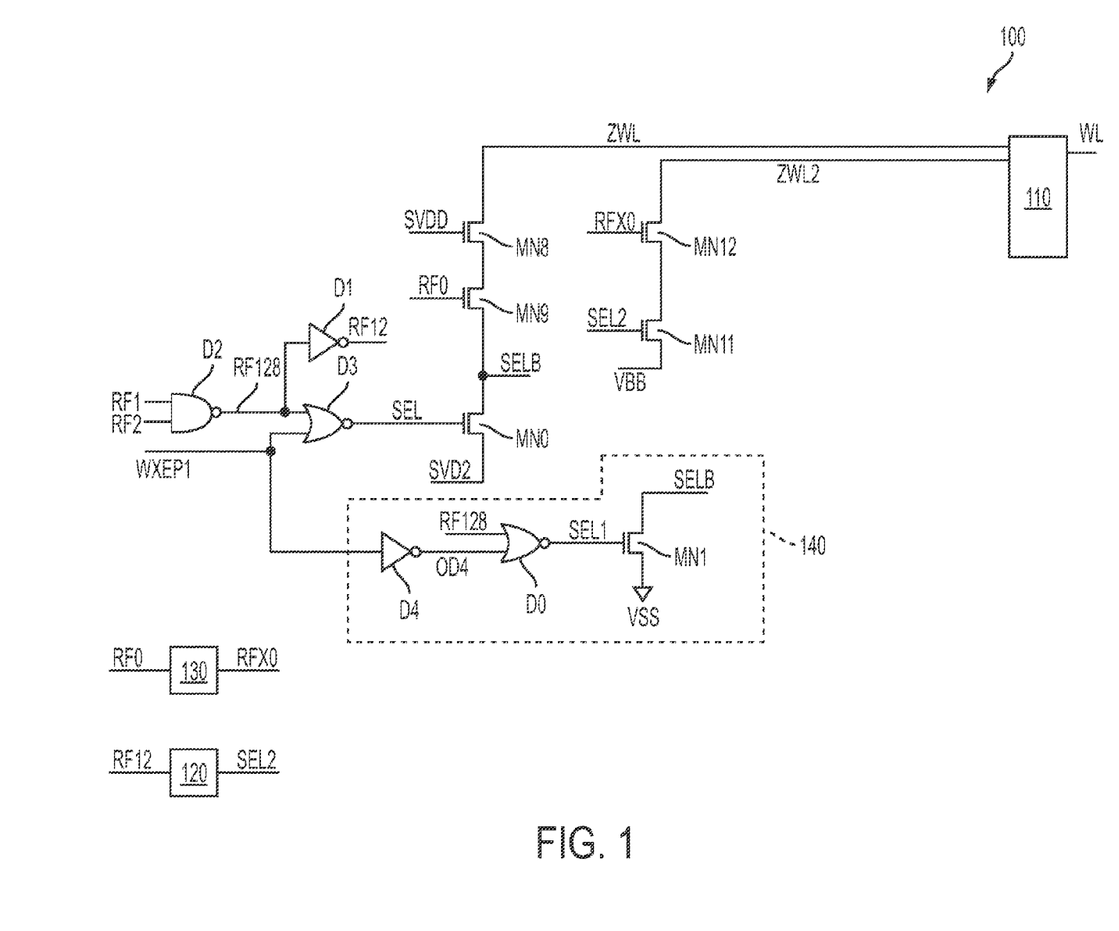
FIG. 1 is a diagram of a driver decoder circuit using a wordline driver circuit, in accordance with some embodiments.

FIG. 1 is a diagram of a driver decoder circuit 100, in accordance with some embodiments. In the below illustration, unless otherwise stated, a high logical value and a low logical value of a signal is operational voltage VDD and reference voltage VSS, respectively. For illustration, the voltage dropped across a gate and a source of each transistor MN1, MN0, MN8, MN9, MN11, and MN12 is called voltage VGSMN1, VGSMN0, VGSMN8, VGSMN9, VGSMN11, and VGSMN12, respectively.

A level shifter 120 level shifts a voltage level of a signal RF12 at an output of an inverter D1 to provide a signal SEL2 to a gate of transistor MN11. For example, level shifter 120 receives signal RF12 having a high and a low logical value at voltage VDD and voltage VSS, respectively. Level shifter 120 provides signal SEL2 that has a high and a low logical value at voltage VDD and voltage VBB, respectively. Level shifter 120 shown in circuit 100 is for illustration. Level shifter 120 could be at other locations. Embodiments of the disclosure are not limited to a particular location of level shifter 120. In some embodiments, one level shifter 120 is used to generate signal SEL2 for use by a plurality of transistors MN11 corresponding to a plurality of signals control ZWL and a plurality of wordline drivers 110.

In some embodiments, circuit 100 receives four signals RF0 level shifted by a level shifter 130 to result in four signals RFX0. Four signals RF0 are received by four transistors MN9 associated with four control signals ZWL. For illustration, only one signal RF0 is shown at an input of level shifter 130 and at a gate of one transistor MN9. Similarly, four signals RFX0 are received by four transistors MN12 associated with four control signals ZWL2. For illustration, only one signal RFX0 is shown at an output of level shifter 130 and at a gate of one transistor MN12.

Level shifter 130 level shifts a voltage level of signal RF0 received at an input of level shifter 130 and at a gate of transistor MN9 to provide a signal RFX0 at an output of level shifter 130 and at the gate of transistor MN12. For example, level shifter 130 receives signal RF0 having a high logical value and a low logical value at voltage VDD and voltage VSS, respectively. Level shifter 130 provides signal RFX0 that has a high logical value and a low logical value at voltage VDD and voltage VBB, respectively. Level shifter 130 shown in circuit 100 is for illustration. Level shifter 130 could be at other locations. Embodiments of the disclosure are not limited to a particular location of level shifter 130. In some embodiments, one level shifter 130 is used to generates signal RFX0 for use by a plurality of transistors MN12 corresponding to a plurality of control signals ZWL2 and a plurality of wordline drivers 110.

In some embodiments, circuit 100 generates four control signals ZWL and four control signals ZWL2 for a memory macro (not shown). Each signal ZWL and each signal ZWL2 are for use by a wordline driver 110. As a result, four signals ZWL and four signals ZWL2 correspond to four wordline drivers 110. For illustration, one signal ZWL is at a drain of a transistor MN8 and at one input of wordline driver 110.

Similarly, one signal ZWL2 is at a drain of transistor MN12 and at another input of wordline driver 110. Additionally, one wordline driver 110 is shown receiving one signal ZWL and one signal ZWL2. A different number of signals ZWL, a different number of signals ZWL2, and a different number of wordline drivers 110 are within the scope of various embodiments. In some embodiments, the memory macro is symmetrical. For example, a number of wordline drivers in one side of the memory macro is the same as a number of wordline drivers in the other side of the memory macro. In some embodiments, the memory macro includes four wordline drivers on each side of the memory macro. Various embodiments of the present disclosures are not limited to the symmetrical memory macro, and are applicable to asymmetrical memory macros.

The Control Signal ZWL

Signals RF1 and RF2 at inputs of a NAND gate D2 are used to decode row addresses, and provide a signal SEL at a gate of transistor MN0 to select a signal ZWL among four signals ZWL. For example, when both signals RF1 and RF2 corresponding to a wordline driver 110 are logically high, a signal RF128 at an output of NAND gate D2 is logically low. When a signal WXEP1 is logically low, signal SEL at an output of a NOR gate D3 is logically high to turn on transistor MN0. At the same time, transistor MN9 is turned on based on a signal RF0 corresponding to the wordline driver 110 defined by signals RF1 and RF2.

Figure 2:
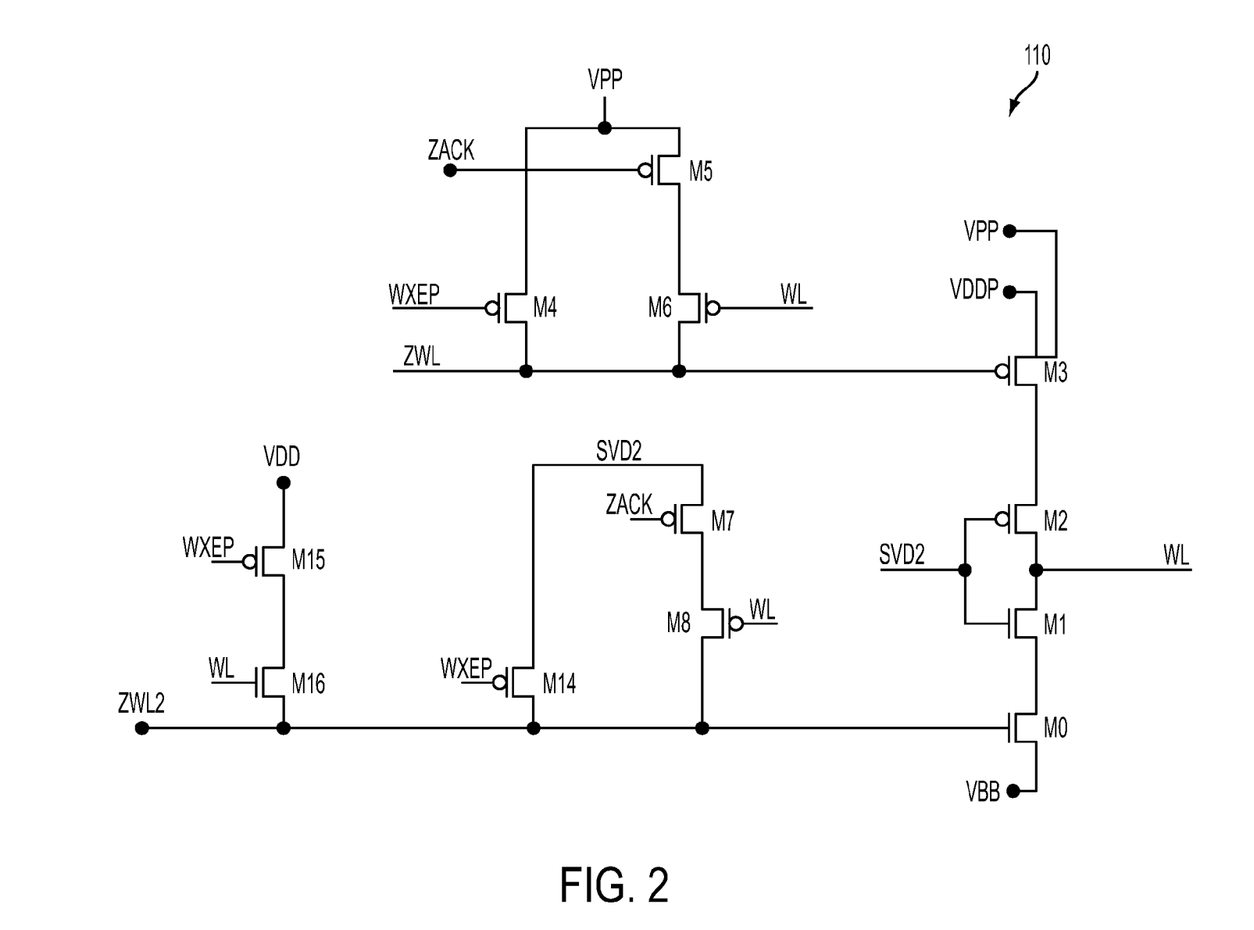
FIG. 2 is a diagram of the wordline driver circuit in FIG. 1, in accordance with some embodiments.

In some embodiments, signal ZWL switches between voltage SVD2 and voltage VPP, and voltage SVD2 is about ½ operational voltage VDD. In other words, a low logical value and a high logical value of signal ZWL is ½ VDD and voltage VPP, respectively. For example, when NMOS transistors MN0, MN9, and MN8 are turned on, signal ZWL at a drain of transistor MN8 is pulled to voltage SVD2 or ½ VDD at a source of transistor MN0. Effectively, the low logical value of signal ZWL is ½ VDD. In contrast, when one of transistors MN0, MN9, and MN8 is turned off, and a transistor M4 in FIG. 2 is turned on, signal ZWL is pulled to voltage VPP at a source of transistor M4. Effectively, the high logical value of signal ZWL is voltage VPP. In some embodiments, a value of voltage SVD2 is selected so that voltage VPP−voltage SVD2 is less than a transistor damaging voltage for thin-oxide transistors. Additionally, the value of voltage SVD2 is also selected so that voltage SVD2−voltage VBB is also less than a transistor damaging voltage for thin-oxide transistors. In some embodiments, the transistor damaging voltage for PMOS transistors is different from the transistor damaging voltage for NMOS transistors. In such a situation, the value of voltage SVD2 coupled to a PMOS transistor is different from the value of voltage SVD2 coupled to an NMOS transistor. In some embodiments, a signal SVDD at a gate of transistor MN8 is a static signal of approximately voltage VDD. As a result, transistor MN8 is always turned on when voltage VDD is activated. Signal RF0 at a gate of transistor MN9 is used to turn on and off transistor MN9. In some embodiments, transistors MN8, MN9 and related signals are selected such that the voltage at the source of transistor MN8 and the drain of transistor MN9 is less than operational voltage VDD−Vt in which Vt is a threshold voltage of transistor MN8. In such a situation, transistor MN9 is protected from the high voltage VPP of signal ZWL at the drain of transistor MN8.

In some embodiments, when signal ZWL is logically low, signal ZWL2 is also logically low, and the corresponding wordline driver 110 is selected to generate a corresponding wordline WL having a high logical value of voltage VPP. In contrast, when signal ZWL is logically high, signal ZWL2 is also logically high, and the corresponding wordline driver 110 is selected to generate wordline WL having a low logical value of voltage VBB.

In some embodiments, signal SEL at the output of NOR gate D3 switches between voltage VDD and voltage VSS. As a result, when signal SEL at the gate of transistor MN0 is logically high at voltage VDD, voltage VGSMN0 is ½ operational voltage VDD. In some embodiments, because ½ voltage VDD is close to a threshold voltage of transistor MN0, transistor MN0 conducts weakly. Consequently, it is more difficult for transistor MN0 to pull signal SELB generated at a drain of transistor MN0 towards voltage SVD2 at a source of transistor MN0. An assist circuit 140 assists in pulling a signal SELB for signal SELB to transition from a high logical value at voltage VDD to voltage SVD2 faster. Pulling signal SELB at the drain of transistor MN0 faster results in pulling signal ZWL at the drain of transistor MN8 faster because signal ZWL is electrically coupled to signal SELB through transistors MN8 and MN9.

Assist circuit 140 includes an inverter D4, a NOR gate D0 and an NMOS transistor MN1. Inverter D4 inverts a signal WXEP1 to provide a signal OD4. In some embodiments, signal WXEP1 starts at the same time as signal WXEP shown in FIG. 2. When both signals RF128 and OD4 are logically low, a signal SEL1 at an output of NOR gate D0 is logically high. Transistor MN1 is therefore turned on, and pulls signal SELB at drains of transistor MN1 and MN0 towards voltage VSS at a source of NMOS transistor MN1. In some embodiments, signal WXEP1 is a positive pulse signal in which the time period that the pulse is logically high defines a time to help pull signal SELB towards voltage VSS. For example, during the time period the pulse is logically high, signal WXEP1 is logically high. Signal OD4 at one input of NOR gate D0 is therefore logically low. When a signal RF128 at the other input of NOR gate D0 is logically low, signal SEL1 is logically high. As a result, transistor MN1 is turned on, and signal SELB at the drain of transistor MN1 is pulled towards voltage VSS at the source of transistor MN1. In contrast, when the positive pulse of signal WXEP1 ends, signal WXEP1 is logically low. Signal OD4 is therefore logically high, and signal SEL1 is logically low regardless of the logical value of signal RF128. As a result, transistor MN1 is turned off and is electrically disconnected from signal SELB. In other words, assisting in pulling down signal SELB ends.

In some embodiments, when one of transistors MN0 and MN1 is turned on, the other transistor is turned off. Effectively, signal SELB is pulled towards voltage SVD2 or voltage VSS by either transistor MN0 or transistor MN1 at one time. For example, when signal WXEP1 is logically high, signal SEL at the output of NOR gate D3 is logically low regardless of the logical value of signal RF128 at the other input of NOR gate D3. Transistor MN0 is therefore turned off. At the same time, signal OD4 that is an inverse of signal WXEP1 through inverter D4 is logically low. If signal RF128 is logically low, signal SEL1 is logically high. Transistor MN1 is therefore turned on. Effectively, transistor MN1 is on while transistor MN0 is off. In contrast, when signal WXEP1 is logically low, signal OD4 is logically high, and signal SEL1 is logically low regardless of the logical value of signal RF128. As a result, transistor MN1 is turned off. At the same time, if signal RF128 is logically low, signal SEL is logically high. As a result, transistor MN0 is turned on. Effectively, transistor MN0 is on while transistor MN1 is off.

In some embodiments, when signal ZWL and thus signal SELB are to be pulled towards voltage SVD2, transistor MN1 is turned on to quickly help pull signal SELB at the drain of transistor MN1 towards voltage VSS at the source of transistor MN1. Transistor MN1 is then turned off to stop assisting pulling signal SELB. Transistor MN0 is then turned on to pull signal SELB to voltage SVD2. The time to turn on transistor MN1 is defined by the positive pulse of signal WXEP1. In some embodiments, when a transition of signal SELB towards voltage SVD2 is acceptably fast, assist circuit 140 is not used to assist in pulling signal SELB.

The Control Signal ZWL2

Signals RF1 and RF2 are also used to provide signal SEL2 at the gate of transistor MN11 to select one signal ZWL2 among four signals ZWL2. For example, when both signals RF1 and RF2 corresponding to a wordline driver 110 are logically high, signal RF128 at the output of NAND gate D2 is logically low. Signal RF12 at an output of an inverter D1 is logically high. Level shifter 120 then level shifts signal RF12 to provide signal SEL2 at the gate of transistor MN11 to turn on transistor MN11. At the same time, transistor MN12 is turned on based on a signal RFX0 corresponding the wordline driver 110 selected by signals RF1 and RF2. Signal RFX0 is the result of signal RF0 being level shifted by level shifter 130.

In some embodiments, signal ZWL2 switches between voltage VBB and voltage SVD2 of about ½ operational voltage VDD. In other words, a low logical value and a high logical value of signal ZWL2 is voltage VBB and ½ voltage VDD, respectively. For example, when both transistors MN11 and MN12 are turned on, signal ZWL2 at a drain of NMOS transistor MN12 is pulled to voltage VBB at a source of transistor MN11. Effectively, the low logical value of signal ZWL2 is voltage VBB. In contrast, when one of transistors MN11 and MN12 is turned off, and a PMOS transistor M14 in FIG. 2 is turned on, signal ZWL2 is pulled to voltage SVD2 at a source of PMOS transistor M14. Effectively, the high logical value of signal ZWL2 is voltage SVD2 or ½ voltage VDD. Signals RFX0 at the gate of transistor MN12 is used to turn on and off transistor MN12. Signal SEL2 at the gate of transistor MN1 is used to turn on and off transistor MN11. In some embodiments, signal RFX0 is shifted to have the voltage values of voltage VDD and voltage VBB to reduce the leakage current through transistor MN12. Similarly, signal SEL2 is shifted to voltage VDD and voltage VBB to reduce the leakage current through transistor MN11. Further, when signal SEL2 at the gate of transistor MN11 is at voltage VBB, voltage VGSM11 is 0 V, and transistor MN11 is fully turned off. In some embodiments, signals at the gates of transistor MN12 and/or transistor MN11 are not level shifted if the leakage current through transistor MN12 and/or transistor MN11 is acceptable. In such a situation, signals RF0 and RF12, for example, are fed to the gates of transistors MN12 and MN11 without being level shifted by shifters 130 and 120, respectively. In some embodiments, transistor MN12 and/or transistor MN11 is selected to have another threshold voltage to reduce the leakage current through transistor MN12 and/or MN11.

In some embodiments, signal ZWL2 switches between voltage VBB and ½ voltage VDD to reduce a leakage current through a transistor M0 in FIG. 2. But when the leakage current through transistor M0 is acceptable, a different voltage swing, such as between voltage VBB and VDD, is used.

In some embodiments, when signal ZWL2 is logically high at ½ voltage VDD, signal ZWL is also logically high, and the corresponding wordline driver 110 is selected to generate wordline WL having a low logical value of voltage VBB. In contrast, when signal ZWL2 is logically low at voltage VBB, signal ZWL is also logically low, and the corresponding wordline driver 110 is selected to generate wordline WL having a high logical value of voltage VPP.

The Wordline Driver

The Output Stage

FIG. 2 is a diagram of wordline driver circuit 110, in accordance with some embodiments. For illustration, the voltage dropped across each gate and each source of transistors M0, M1, M2, M3, and M14 is called voltage VGSM0, VGSM1, VGSM2, VGSM3, and VGSM14, respectively.

A pair of PMOS transistors M3 and M2 and a pair of NMOS transistors M1 and M0 form an output stage for wordline driver 110. Wordline WL is coupled to drains of PMOS transistor M2 and NMOS transistor M1. In some embodiments, wordline WL is used to control a row of memory cells in a memory macro.

A gate of PMOS transistor M3 is configured to receive signal ZWL. A source of PMOS transistor M3 is configured to receive both voltage VPP and voltage VDDP. A drain of PMOS transistor M3 is coupled to the source of PMOS transistor M2. Gates of PMOS transistor M2 and NMOS transistor M1 are coupled together, and are configured to receive voltage SVD2. A drain of PMOS transistor M2 is coupled to a drain of NMOS transistor M1, and is configured as wordline WL. A source of NMOS transistor M1 is coupled to a drain of NMOS transistor M0. The source of NMOS transistor M0 is configured to receive voltage VBB. A gate of NMOS transistor M0 is configured to receive signal ZWL2.

Voltage VDDP at the source of PMOS transistor M3 switches between voltage VPP and voltage VDD. In some embodiments, voltage SVD2 at the gates of transistors M1 and M2 is about ½ voltage VDD. Voltage VBB is about −½ voltage VDD. Voltage VPP is about VDD+½ VDD. In some embodiments, voltage VPP is 1.5 V, and voltage VDD is 0.9 V.

In some embodiments, when wordline driver 110 is in a standby mode, the source of transistor PMOS M3 has voltage VDD to reduce the leakage current through transistor M3. In contrast, when circuit 110 is in an active mode, transistor M3 is turned on, and the source of PMOS transistor M3 has voltage VPP.

Based on logical values of signals ZWL, SVD2, and ZWL2 applied at gates of transistors M3, M2, M1, and M0, PMOS transistors M3 and M2 are each turned on at the same time, and NMOS transistors M1 and M0 are each turned on at the same time. Further, when PMOS transistors M3 and M2 are turned on, at least one of NMOS transistors M1 and M0 is turned off. As a result, wordline WL is pulled to voltage VPP at the source of transistor M3. In other words, the high logical value of wordline WL is voltage VPP. Similarly, when NMOS transistors M1 and M0 are turned on, at least one of PMOS transistors M2 and M3 is turned off. As a result, wordline WL is pulled to voltage VBB at the source of NMOS transistor M0. In other words, the low logical value of wordline WL is voltage VBB.

The Wordline Driver

The PMOS Side

For illustration, circuits and signals associated signal ZWL and with PMOS transistors M3 and M2 are called a PMOS side. A PMOS transistor M4 is used to provide a high logical value at voltage VPP for signal ZWL. For example, in a pre-charge mode, a signal WXEP at a gate of PMOS transistor M4 is applied with a low logical value. As a result, PMOS transistor M4 is turned on. Signal ZWL at a drain of transistor M4 is pulled to voltage VPP at a source of transistor M4. Effectively, signal ZWL is pre-charged to voltage VPP. In some embodiments, signal WXEP is shared among a plurality of wordline drivers.

In some embodiments, the memory macro that uses circuit 100 and wordline driver 110 includes a plurality of wordlines WL corresponding to a plurality of rows of memory cells. When a memory cell in a row is accessed, the corresponding wordline WL is activated while the other wordlines are deactivated. PMOS transistors M5 and M6 are used to deactivate or turn off the wordlines that are not selected. PMOS transistors M5 and M6 also keep the unselected wordlines deactivated. In some embodiments, before a wordline WL is activated, all wordlines WL in the memory macro are deactivated. For illustration, wordline WL shown in FIG. 2 is not selected and is therefore deactivated at a logical low value and remains deactivated while another word line WL is activated with a high logical value. In other words, wordline WL in FIG. 2 is pulled to the low voltage value VBB at the source of NMOS transistor M0. For example, at the time transistor M3 is turned off, transistors M1 and M0 are turned on to pull wordline WL at the drain of transistor M1 to voltage VBB at the source of transistor M0. When wordline WL at the gate of PMOS transistor M6 is logically low, transistor M6 is turned on, and a signal ZACK at a gate of PMOS transistor M5 is also logically low, which turns on PMOS transistor M5. In some embodiments, signal ZACK turns logically low a delay after signal WXEP at a gate of PMOS transistor M4 turns logically high. Because transistors M5 and M6 are on, signal ZWL at a drain of PMOS transistor M5 is pulled to voltage VPP at a source of transistor M5. Voltage VGSM3 is therefore 0 V, and transistor M3 is turned off. At the time transistor M3 is turned off, transistors M1 and M0 are turned on to pull wordline WL at the drain of transistor M1 to voltage VBB at the source of transistor M0. When another wordline is activated, transistors M6 and M5 of the deactivated wordline WL continue to be turned on to pull signal ZWL to voltage VPP. Effectively, transistor M3 continues to be turned off, and wordline WL continues to be deactivated. If wordline WL is selected, however, at least one of transistors M5 and M6 is turned off. As a result, wordline WL is affected by other circuits including transistors M4, M3, M2, M1, and M0.

In some embodiment, signal ZWL switches between voltage VPP and voltage SVD2, in which voltage SVD2 is about ½ voltage VDD. As a result, when signal ZWL is at voltage SVD2, voltage VGSM3 is at ½ VDD−VPP, and PMOS transistor M3 is turned on. In contrast, when signal ZWL is at voltage VPP, voltage VGSM3 is 0 V, and PMOS transistor M3 is turned off.

The Wordline Driver

The NMOS Side

For illustration, circuits and signals associated signal ZWL2 and with NMOS transistors M1 and M0 are called the NMOS side. A PMOS transistor M14 is used to provide the high voltage value SVD2 for signal ZWL2. For example, in a pre-charge mode, signal WXEP at a gate of PMOS transistor M14 is applied with a logically low value. As a result, PMOS transistor M14 is turned on. Signal ZWL2 at a drain of transistor M14 is pulled to voltage SVD2 at a source of transistor M14. Effectively, signal ZWL2 is pre-charged to voltage SVD2, which is about ½ voltage VDD, in some embodiments.

In some embodiments, the memory macro includes a plurality of wordlines corresponding to a plurality of rows of memory cells. When a memory cell in a row is accessed, the corresponding wordline WL is activated while other wordlines are deactivated. PMOS transistors M7 and M8 are used to deactivate or turn off the wordlines that are not selected. PMOS transistors M7 and M8 also keep the unselected wordlines deactivated. In some embodiments, before a wordline WL is activated, all wordlines in the memory macro are deactivated. For illustration, wordline WL shown in FIG. 2 is not selected and is therefore deactivated and maintains deactivated while another wordline WL is activated. In other words, wordline WL is pulled to the low voltage value VBB at the source of NMOS transistor M0. When wordline WL at the gate of PMOS transistor M8 is logically low, transistor M8 is turned on. At that time, signal ZACK at a gate of PMOS transistor M7 is applied with a low logical value, which turns on PMOS transistor M7. Because transistors M7 and M8 are on, signal ZWL2 at a drain of PMOS transistor M8 is pulled to voltage SVD2 at a source of transistor M7. Voltage VGSM0 is therefore voltage VDD, and transistor M0 is turned on. At the same time, based logical values of signals ZWL, SVD2, and ZWL2 applied at the gates of transistors M3, M2, M1, and M0, transistors M3 and M2 are turned off, and transistor M1 is turned on. Because transistors M1 and M0 are on, transistors M1 and M0 pull wordline WL at the drain of transistor M1 to voltage VBB at the source of transistor M0. When another wordline is activated, transistors M8 and M7 continue to be turned on to pull signal ZWL2 to voltage SVD2. Effectively, transistor M0 continues to be turned on, and wordline WL continues to be pulled to voltage VBB at the source of NMOS transistor M0. If wordline WL is selected, however, at least one of transistors M7 and M8 is turned off. As a result, wordline WL is affected by other circuits including transistors M14, M3, M2, M1, and M0.

In some embodiments, when PMOS transistor M14 is turned on, PMOS transistor M14 conducts weakly. For example, in some embodiments, signal WXEP at the gate of PMOS transistor M14 is about voltage VSS for a low logical value that turns on transistor M14. Voltage SVD2 at the source of PMOS transistor M14 is about ½ voltage VDD. As a result, voltage VGDM14 is about −½ voltage VDD, which is close to a threshold voltage of PMOS transistor M14 in some embodiments. PMOS transistor M14 therefore conducts weakly. Consequently, signal ZWL2 at a drain of PMOS transistor M14 is weakly pulled to voltage SVD2 at the source of transistor M14.

A PMOS transistor M15 and an NMOS transistor M16 form an assistant circuit to boost voltage for signal ZWL2. For example, when signal WL at a gate of transistor M16 is logically high, NMOS transistor M16 is turned on. At that time, signal WXEP at a gate of PMOS transistor M15 is applied with a low logical value, which turns on PMOS transistor M15. Because both transistors M16 and M15 are turned on, signal ZWL2 is pulled to voltage VDD at a source of transistor M15. Effectively, signal ZWL2 is pulled to voltage VDD through transistors M15 and M16 faster than signal ZWL2 is pulled to voltage SVD2 through transistor M14. As a result, transistor M0 is turned on by signal ZWL2 faster, and wordline WL is turned off faster. The voltage boost for signal ZWL2 by transistors M16 and M15 is turned off automatically. For example, when wordline WL is being turned off, wordline WL transitions from a high logical value towards a low logical value. When the voltage on wordline WL is lower than a threshold voltage of NMOS transistor M16, transistor M16 is turned off, which, effectively, turns of the voltage boost.

For illustration, a transistor having a width X and a length Y is called an X*Y transistor. Some embodiments are advantageous because transistors M3, M2, M1, and M0 are not thick-oxide transistors compared to transistors in other approaches. As a result, the combined size of transistors M3, M2, M1, and M0 and associated circuits is smaller than the combined size of the transistors and associated circuits in other approaches that provide similar functions. For example, compared with an existing approach, two smaller PMOS transistors M3 and M2 in FIG. 2 of the present disclosure are used in place of one larger PMOS transistor in the existing approach. Similarly, two smaller NMOS transistors M1 and M0 in FIG. 2 are used in place of one large NMOS transistor in the existing approach. The combined size of two smaller PMOS transistors M3 and M2 in various embodiments is smaller than the size of the single larger PMOS transistor in the existing approach. For example, the single PMOS transistor in the existing approach is a 9μ*120 nm transistor. In contrast, each of transistors M3 and M2 is a 6μ*40 nm transistor. The combined size of two 6μ*40 nm transistors is smaller than the size of the 9μ*120 nm transistor. Similarly, the combined size of two smaller transistors M1 and M0 in various embodiments is smaller than the size of the single larger NMOS transistor in the existing approach. For example, the single NMOS transistor in the existing approach is a 3μ*120 nm transistor. In contrast, each of transistors M1 and M0 is a 2μ*40 nm transistor. The combined size of two 2μ*40 nm transistors is smaller than the size of the 3μ*120 nm transistor.

In some embodiments, selecting the size for each transistor M3, M2, M1, and M0 depends on various factors such as the load or the number of memory cells being connected to wordline WL, a rise time and a fall time of wordline WL, and thus a speed for the memory cell, etc. For example, a larger number of memory cells connected to wordline WL demands a larger size for transistor M3, M2, M1, and/or M0 to turn on and turn off wordline WL. A larger size demands a larger layout area and/or higher power consumption. A faster rise time and/or a faster fall time results in a faster switching time for wordline WL, and thus a faster speed for the memory, etc. In some embodiments, a simulation is performed to determine the size of each of transistors M3, M2, M1, and M0 considering the trade off between the speed, the power consumption, the layout area, etc.

In some embodiments, thousands of each of transistors M3, M2, M1, and M0 are present in the memory macro. As a result, a saving in a die area for a pair of transistors M3 and M2 and a pair of transistors M1 and M0 results in a large saving in the die area for the memory macro.

Another Exemplary Circuit

Figure 3:
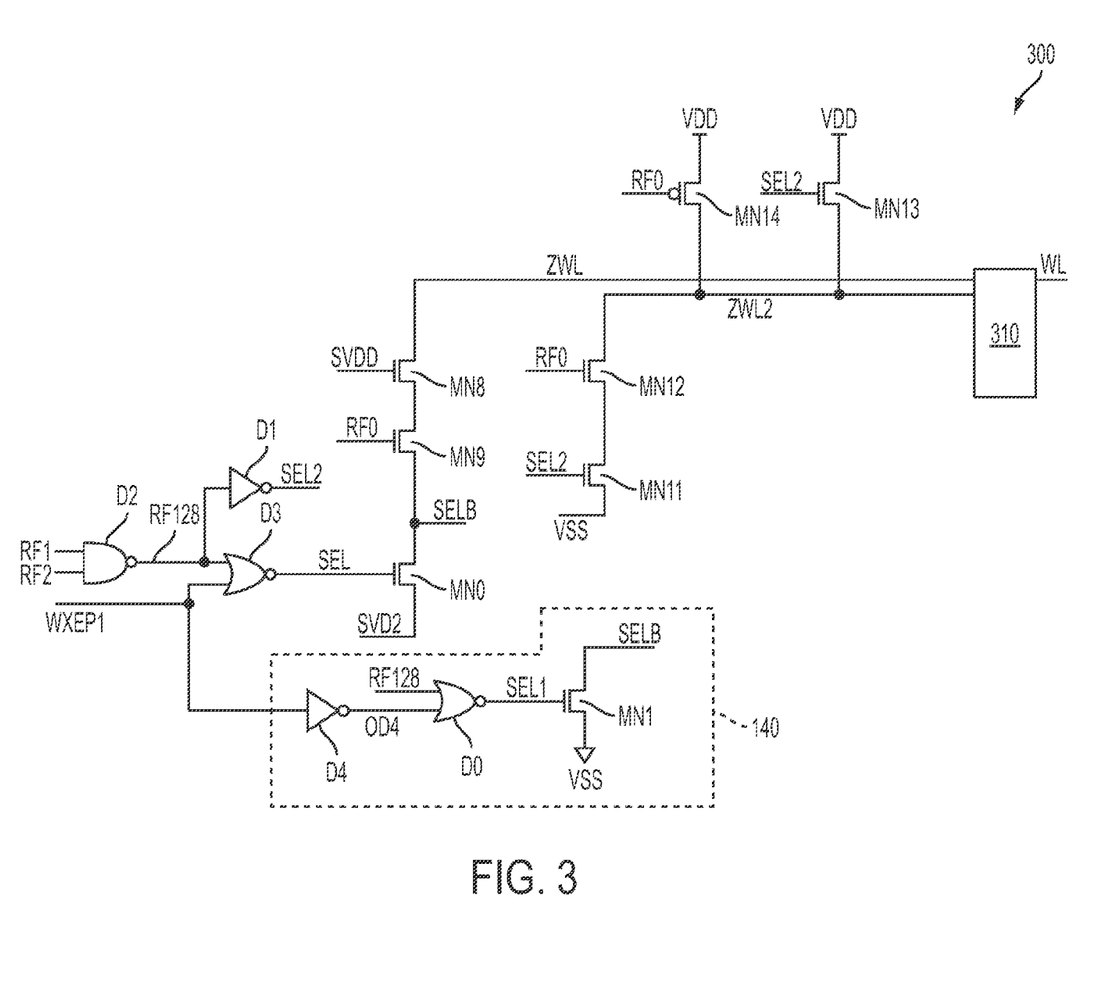
FIG. 3 is a diagram of another driver decoder circuit using another wordline driver circuit, in accordance with some embodiments.

FIG. 3 is a diagram of a circuit 300, in accordance with some embodiments.

Circuit 300 includes a wordline driver 310, which will be explained in details with reference to FIG. 4. Wordline driver 310 includes changes compared with wordline driver 110 in circuit 100 of FIG. 1. Other changes in circuit 300 compared with circuit 100 are adapted to function with wordline driver 310.

Compared with circuit 100, circuit 300 additionally includes transistors MN13 and MN14. A gate of transistor MN13 is configured to receive signal SEL2. A source of transistor MN13 is configured to receive voltage VDD. A drain of transistor MN13 is configured to receive signal ZWL2. A gate of transistor MN14 is configured to receive signal RF0. A source of transistor MN14 is configured to receive voltage VDD. A drain of transistor MN14 is configured to receive signal ZWL2.

PMOS transistors MN13 and MN14 are used to provide voltage VDD to signal ZWL2. For example, when transistor MN13 is on, signal ZWL2 at the drain of transistor MN13 is pulled to voltage VDD at the source of transistor MN13. Similarly, when transistor MN14 is on, signal ZWL2 at the drain of transistor MN14 is pulled to voltage VDD at the source of transistor MN14. Signal ZWL2 is pulled to voltage VDD by one or a combination of transistor MN13 and MN14. Because signal RF0 is applied at the gates of PMOS transistor MN14 and NMOS transistor MN12, when PMOS transistor MN14 is on, NMOS transistor MN12 is off, and vice versa. Because signal SEL2 is applied at the gates of PMOS transistor MN13 and NMOS transistor MN11, when PMOS transistor MN13 is turned on, NMOS transistor MN11 is turned off, and vice versa. Effectively, transistors MN11, MN12, MN13, and MN14 perform a NAND function.

Circuit 300 does not include level shifter 120 of circuit 100 in FIG. 1. Effectively, inverter D1 generates signal SEL2, which is fed to the gate of transistor MN11. In other words, in circuit 300, the high and the low logical value for signal SEL2 at the gate of transistor MN11 is voltage VDD and voltage VSS, respectively. In contrast, in circuit 100, the high and the low logical value for signal SEL2 at the gate of transistor MN11 is voltage VDD and VBB, respectively. Further, the source of transistor MN11 in FIG. 3 is configured to receive voltage VSS while the source of transistor MN11 in FIG. 1 is configured to receive voltage VBB.

Circuit 300 does not include level shifter 130 in circuit 100 in FIG. 1. Effectively, circuit 300 receives signal RF0 at the gate of transistor MN12. In other words, in circuit 300, the high and the low logical value for signal RF0 at the gate of transistor MN12 is voltage VDD and voltage VSS, respectively. In contrast, in circuit 100, the high and the low logical value for signal RFX0 at the gate of transistor MN12 is voltage VDD and VBB, respectively.

Another Wordline Driver

Figure 4:
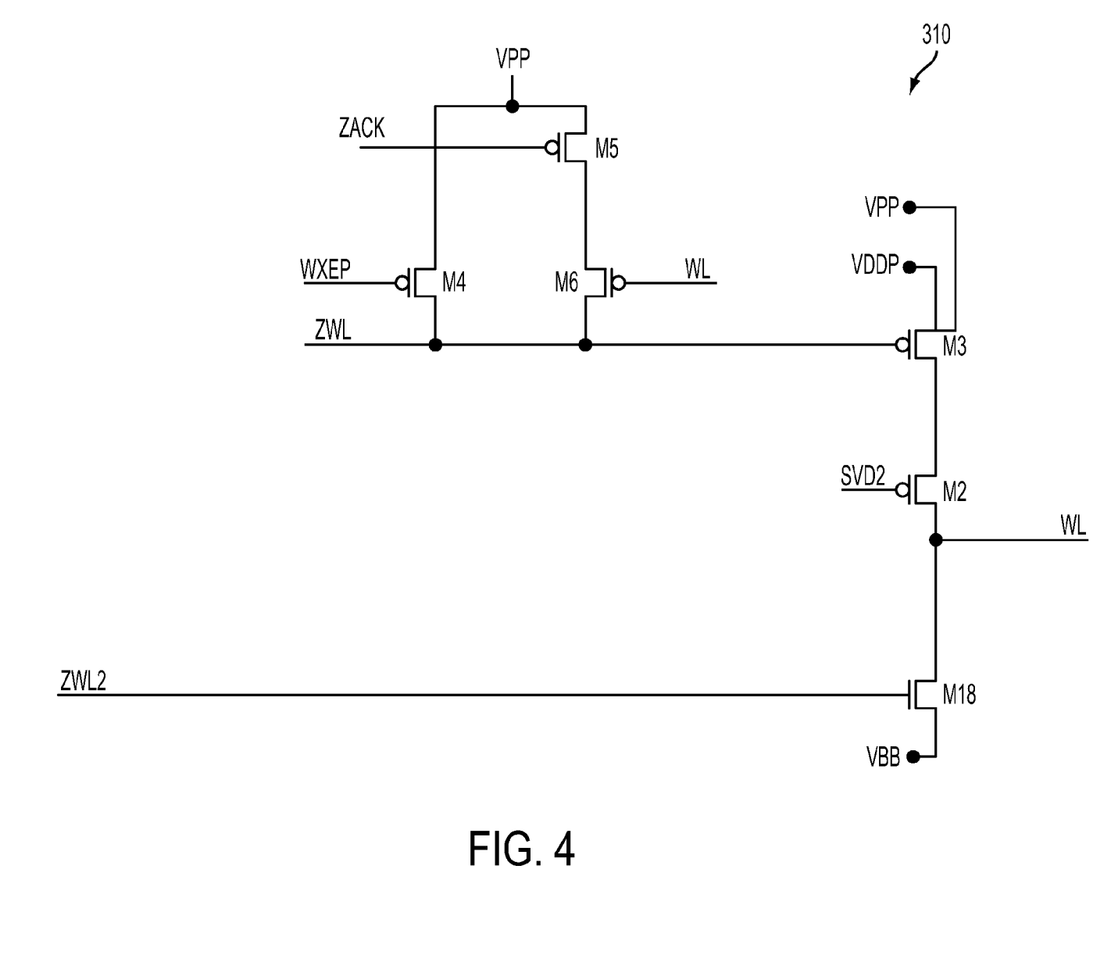
FIG. 4 is a diagram of the wordline driver circuit in FIG. 3, in accordance with some embodiments.

FIG. 4 is a diagram of wordline driver 310, in accordance with some embodiments.

Compared with wordline driver 110 in FIG. 2, wordline driver 310 does not include NMOS transistor M1 at the output stage. Wordline driver 310 does not include circuits associated with the NMOS-side of word line driver 110, such as transistors M15, M16, M14, M8, and M7 in FIG. 2.

Transistor M18 in wordline driver 310 corresponds to transistor M0 in wordline driver 110. Transistor M18, however, is a thick-oxide transistor. For example, in some embodiments, transistor M18 is a 3μ*120 nm transistor.

Signal ZWL2 switches between voltage VDD and voltage VSS.

Effectively, wordline driver 310 generates wordline WL having a voltage swing of voltage VPP and voltage VBB. For example, when NMOS transistor M18 is off and PMOS transistors M2 and M3 are on, wordline WL is pulled to voltage VPP at the source of transistor M3. In other words, the high logical value of wordline WL is voltage VPP. In contrast, when NMOS transistor M18 is on and at least one of PMOS transistors M2 and M3 is off, wordline WL is pulled to voltage VBB at the source of transistor M18. In other words, the low logical value of wordline WL is voltage VBB.

Exemplary Methods

Figure 5:
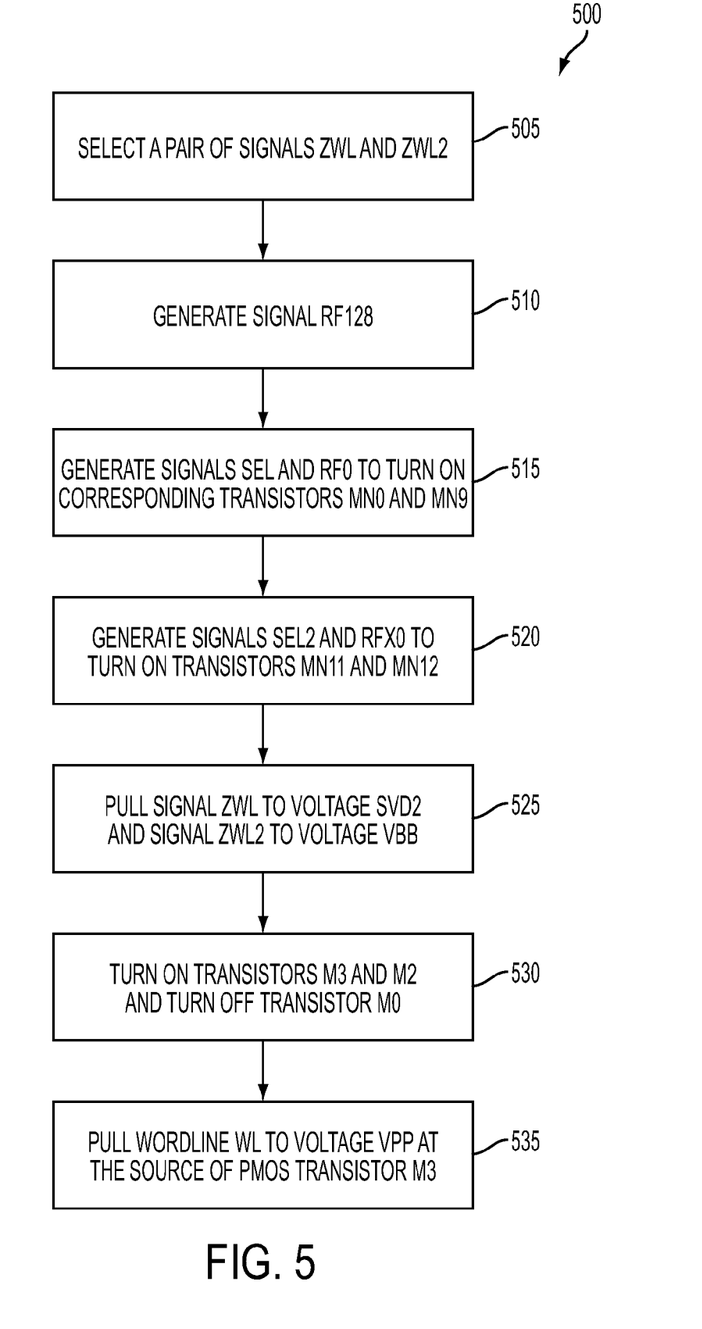
FIGS. 5 and 6 are flowcharts illustrating the operations of the wordline driver decoder circuit in FIG. 1, in accordance with some embodiments.

FIG. 5 is a flowchart of a method 500 for activating wordline WL, in accordance with some embodiments. In this illustration, for simplicity, circuit 140 is not used to assist in pulling signal SELB, nor signal ZWL. In other words, signal WXEP1 has a low logical value.

The below operations 505 to 525 are explained with reference to FIG. 1, while operations 530 to 535 are explained with reference to FIG. 2.

In operation 505, a pair of control signals ZWL and ZWL2 among a plurality of pairs of signals ZWL and ZWL2 is selected, based on signals RF1 and RF2, respectively. For illustration, the pair of signals ZWL and ZWL2 shown in FIG. 1 is selected. As a result, when signal RF1 and RF2 are logically high, signals RF1 and RF2 correspond to the pair of signals ZWL and ZWL2 shown in FIG. 1.

In operation 510, because signals RF1 and RF2 are logically high, NAND gate D2 generates signal RF128 having a low logical value.

In operation 515, because both signal WXEP1 and signal RF128 are logically low, NOR gate D3 generates signal SEL having a high logical value, which turns on transistor MN0. At the same time, signal RF0 at the gate of transistor MN9 is applied with a high logical value, which turns on transistor MN9. Transistor MN8 has been turned on because transistor MN8 receives a high voltage value SVDD at the gate of transistor MN8. In addition, inverter D1 inverts the low logical value of signal RF128 to provide a high logical value for signal RF12.

In some embodiments, before transistor MN0 is turned on, circuit 140 is invoked to pull down signal SELB at the drain of transistor MN0 for a short period of time.

In operation 520, level shifter 120 level shifts the high logical value of signal RF12 to provide signal SEL2 to the gate of transistor MN11. As a result, transistor MN11 is turned on. Level shifter 130 also levels shifts the high logical value of signal RF0 to provide signal RFX0 to the gate of transistor MN12. As a result, transistor MN12 is turned on.

In operation 525, transistors MN0, MN8, and MN9 being turned on pull signal ZWL to voltage SVD2 at the source of transistor MN0. Similarly, transistors MN11 and MN12 being turned on pull signal ZWL2 to voltage VBB at the source of transistor MN11.

The following operations 530 to 535 are with reference to FIG. 2. For illustration, signal ZWL is not electrically affected by transistors M4, M5 and M6. Similarly, signal ZWL2 is not electrically affected by transistors M14, M7, M8, M15 and M16.

In operation 530, signal ZWL at the gate of transistor M3 has voltage SVD2 or ½ voltage VDD, which causes voltage VGSM3 to be −VDD because the source of transistor M3 has voltage VPP or (VDD+½ VDD). As a result, transistor M3 is turned on.

The gate of transistor M2 has voltage SVD2 or ½ voltage VDD and the source of transistor M2 has voltage VPP or VDD+½ VDD, which causes voltage VGSM2 to be −VDD. The source of transistor M2 has voltage VPP because the source of transistor M2 is coupled to the drain of transistor M3, and is pulled to voltage VPP at the source of transistor M3. As a result, transistor M2 is turned on.

Signal ZWL2 at the gate of transistor M0 being at voltage VBB causes voltage VGSM0 to be 0 V because the source of transistor is also voltage VBB. As a result, NMOS transistor M0 is off.

In operation 535, because NMOS transistor M0 is off while PMOS transistors M2 and M3 are on, PMOS transistors M2 and M3 pull wordline WL to voltage VPP at the source of transistor M3. Effectively, wordline WL is logically high or activated.

Figure 6:
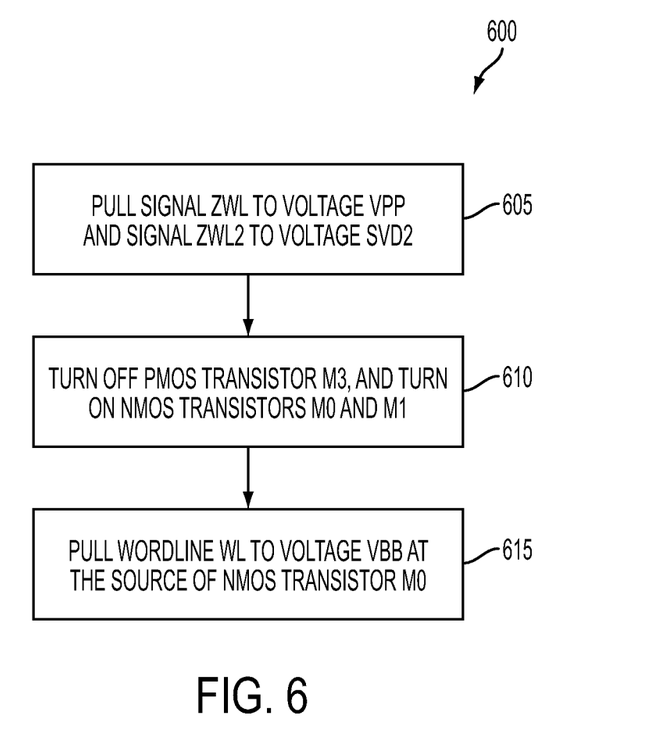

FIG. 6 is a flowchart of a method 600 for deactivating wordline WL to a low logical value.

In operation 605, signal WXEP at the gate of transistor M4 in FIG. 2 is applied with a low logical value. As a result, transistor M4 is turned on, which pulls signal ZWL to voltage VPP at the source of transistor M4. Similarly, signal WXEP is also at the gate of transistor M14 and therefore turns on transistor M14. As a result, transistor M14 pulls signal ZWL2 at the gate of transistor M14 to voltage SVD2 at the source of transistor M14.

In operation 610, signal ZWL having voltage VPP causes voltage VGSM3 to be 0 V, which turns off transistor M3.

Signal ZWL2 having voltage SVD2 causes voltage VGSM0 to be voltage VDD. As a result, transistor M0 is turned on.

The drain of transistor M0 coupled to the source of transistor M1 is pulled to voltage VBB at the source of transistor M0. As a result, voltage VGSM1 is voltage VDD, which causes transistor M1 to turn on.

In operation 615, because transistor M3 is off, and transistors M0 and M1 are on, transistors M1 and M0 pull wordline WL to voltage VBB at the source of transistor M0. Effectively, wordline WL is logically low or deactivated. In some embodiments, in operation 610, transistors M15 and M16 pull signal ZWL2 towards voltage SVD2 faster. As a result, transistor M0 is turned off faster, and wordline WL is deactivated faster.

Methods 500 and 600 are explained in the context of circuits 100 and 110. Operations of circuits 300 and 310 are similar.

A number of embodiments have been described. It will nevertheless be understood that various modifications may be made without departing from the spirit and scope of the disclosure. For example, the various transistors being shown as a particular dopant type, such as N-type or P-type Metal Oxide Semiconductor (NMOS or PMOS), are for illustrations. Embodiments of the disclosure are not limited to a particular type. Selecting different dopant types for a particular transistor is within the scope of various embodiments. A low or high logic value of the various signals used in the above description is also for illustration purposes. Various embodiments are not limited to a particular level when a signal is activated and/or deactivated. Selecting different levels is within the scope of various embodiments. For example, the described embodiments are for a memory cell access transistor of the NMOS type where an on-voltage for wordline WL is voltage VPP and an off-voltage is voltage VBB. In contrast, when the memory cell access transistor is a PMOS type, the on-voltage for wordline WL is voltage VBB and the off-voltage is voltage VPP. In various embodiments, a transistor functions as a switch. A switching circuit used in place of a transistor is within the scope of various embodiments.

In some embodiments, a circuit comprises a first transistor of a first type, a second transistor of the first type, and a first transistor of a second type. The first transistor of the first type has a first first-type drain, a first first-type source, and a first first-type gate. The second transistor of the first type has a second first-type drain, a second first-type source, and a second first-type gate. The first transistor of the second type has a first second-type drain, a first second-type source, and a first second-type gate. The first first-type drain is coupled to the second first-type source. The first first-type source is configured to have a first voltage value. The first first-type gate is configured to have a first control signal. The second first-type drain is configured to serve as a wordline. The second first-type gate is configured to have a second voltage value. The first second-type source is configured to have a third voltage value. The first second-type gate is configured to have a second control signal. The first transistor and the second transistor of the first type are configured to provide the first voltage value for the wordline. The first transistor of the second type is configured to provide the third voltage value for the wordline.

In some embodiments, a circuit comprises a first transistor of a first type, a second transistor of the first type, a first transistor of the second type, and a second transistor of the second type. The first transistor of the first type has a first first-type drain, a first first-type source, and a first first-type gate. The second transistor of the first type has a second first-type drain, a second first-type source, and a second first-type gate. The first transistor of the second type has a first second-type drain, a first second-type source, and a first second-type gate. The second transistor of the second type has a second second-type drain, a second second-type source, and a second second-type gate. The first first-type drain is coupled to the second first-type source. The first first-type source is configured to have a first voltage value. The first first-type gate is configured to have a first control signal. The second first-type drain is coupled to the second second-type drain and is configured to serve as a wordline. The second first-type gate is coupled to the second second-type gate and is configured to have a second voltage value. The second second-type source is coupled to the first second-type drain. The first second-type source is configured to have a third voltage value. The first second-type gate is configured to have a second control signal. The first control signal is configured to switch between the first voltage value and the second voltage value. The second control signal is configured to switch between the second voltage value and the third voltage value.

In some embodiments, a circuit comprises a first transistor of a first type, a second transistor of the first type, at least one third transistor of the first type, at least one fourth transistor of the first type, a first transistor of the a second type, at least one second transistor of the second type, and at least one third transistor of the second type. The first transistor of the first type has a first first-type drain, a first first-type source, and a first first-type gate. The second transistor of the first type has a second first-type drain, a second first-type source, and a second first-type gate. The first transistor of the second type has a first second-type drain, a first second-type source, and a first second-type gate. The first first-type drain is coupled to the second first-type source. The first first-type source is configured to have a first voltage value. The first first-type gate is configured to have a first control signal. The second first-type drain is configured to serve as a wordline. The second first-type gate is configured to have a second voltage value. The first second-type source is configured to have a third voltage value. The first second-type gate is configured to have a second control signal. The at least one third transistor of the first type is configured to provide the first voltage value to the first control signal. The at least one second transistor of the second type is configured to provide the second voltage value to the first control signal. The at least one fourth transistor of the first type is configured to provide the second voltage value to the second control signal. The at least one third transistor of the second type is configured to provide the third voltage value to the second control signal.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a signal generation circuit;
a first transistor of a first type having a drain, a source, and a gate;
a second transistor of the first type having a drain, a source, and a gate; and
a first transistor of a second type having a drain, a source, and a gate,
wherein the circuit is configured to have
the drain of the first transistor of the first type coupled to the source of the second transistor of the first type;
a first voltage value at the source of the first transistor of the first type;
a first control signal at the gate of the first transistor of the first type;
the drain of the second transistor of the first type serve as a wordline
a third voltage value at the source of the first transistor of the second type;
a second control signal at the gate of the first transistor of the second type;
the first transistor of the first type and the second transistor of the first type provide the first voltage value for the wordline;
the first transistor of the second type provide the third voltage value for the wordline;
a same second voltage value at the gate of the second transistor of the first type when the wordline has the first voltage value and when the wordline has the third voltage value; and
the signal generation circuit generate the first control signal and the second control signal, the first control signal having a first logically high level when the second control signal has a second logically high level, the first control signal having a first logically low level when the second control signal has a second logically low level, the first logically high level being different from the second logically high level, and the first logically low level being different from the second logically low level.

2. The circuit of claim 1, further comprising:
a second transistor of the second type having a drain, a source, and a gate,
wherein
the drain of the second transistor of the second type is coupled to the drain of the second transistor of the first type;
the source of the second transistor of the second type is coupled to the drain of the first transistor of the second type; and
the gate of the second transistor of the second type is coupled to the gate of the second transistor of the first type.

3. The circuit of claim 2, wherein the signal generation circuit is configured to cause
the first control signal to switch between the first voltage value and the second voltage value; and
the second control signal to switch between the second voltage value and the third voltage value.

4. The circuit of claim 1, wherein
the second voltage value differs from the first voltage value by an amount less than a transistor damaging voltage.

5. The circuit of claim 1, wherein
the drain of the first transistor of the second type is coupled to the drain of the second transistor of the first type;
the signal generation circuit is configured to cause the second control signal to switch between a fourth voltage value and the third voltage value; and
the first control signal to switch between the first voltage value and the second voltage value;
the first voltage value is higher than the fourth voltage value;
the fourth voltage value is higher than the second voltage value; and
the third voltage value has a negative voltage value.

6. The circuit of claim 5, wherein the signal generation circuit comprises:
a third transistor of the first type having a drain, a source, and a gate; and
a third transistor of the second type having a drain, a source, and a gate,
wherein the signal generation circuit is configured to have
the second control signal at the source of the third transistor of the second type;
the drain of the third transistor of the second type coupled to the drain of the third transistor of the first type; and
the fourth voltage value at the source of the third transistor of the first type.

7. The circuit of claim 1, wherein the signal generation circuit comprises:
a third transistor of the first type having a drain, a source, and a gate;
a fourth transistor of the first type having a drain, a source, and a gate; and
a fifth transistor of the first type having a drain, a source, and a gate,
wherein the signal generation circuit is configured to have
the first control signal at the drain of the third transistor of the first type;
the first voltage value at the source of the third transistor of the first type;
the drain of the fourth transistor of the first type coupled to the source of the fifth transistor of the first type;
the first voltage value at the source of the fourth transistor of the first type; and
the first control signal at the drain of the fifth transistor of the first type.

8. The circuit of claim 1, wherein the signal generation circuit comprises:
a second transistor of the second type having a drain, a source, and a gate;
a third transistor of the second type having a drain, a source, and a gate; and
a fourth transistor of the second type having a drain, a source, and a gate,
wherein the signal generation circuit is configured to have
the first control signal at the drain of the second transistor of the second type;
the source of the second transistor of the second type coupled to the drain of the third transistor of the second type;
the source of the third transistor of the second type coupled to the drain of the fourth transistor of the second type; and
the second voltage value at the source of the fourth transistor of the second type.

9. The circuit of claim 8, wherein the signal generation circuit comprises:
a fifth transistor of the second type having a drain, a source, and a gate,
wherein the signal generation circuit is configured to have
the drain of the fifth transistor of the second type coupled to the drain of the fourth transistor of the second type;
a voltage value at the source of the fifth transistor of the second type, the voltage value lesser than the second voltage value; and
a signal at the gate of the fifth transistor of the second type, the signal having a pulse width that defines the time the fifth transistor of the second type is turned on.

10. The circuit of claim 1, wherein the signal generation circuit comprises:
a second transistor of the second type having a drain, a source, and a gate; and
a third transistor of the second type having a drain, a source, and a gate,
wherein the signal generation circuit is configured to have
the second control signal at the drain of the second transistor of the second type;
the source of the second transistor of the second type coupled to the drain of the third transistor of the second type; and
the third voltage value at the source of the third transistor of the second type.

11. The circuit of claim 10, wherein the signal generation circuit is configured to have
a first gate signal at the gate of the second transistor of the second type, the first gate signal switching between the third voltage value and a fourth voltage value; and
a second gate signal at the gate of the third transistor of the second type, the second gate signal switching between the third voltage value and the fourth voltage value.

12. The circuit of claim 10, wherein the signal generation circuit comprises:
a third transistor of the first type having a drain, a source, and a gate; and
a fourth transistor of the second type having a drain, a source, and a gate;
wherein the signal generation circuit is configured to have
the second control signal at the drain of the third transistor of the first type;
a fourth voltage value at the source of the third transistor of the first type;
the second control signal at the source of the fourth transistor of the second type; and
the fourth voltage value at the drain of the fourth transistor of the second type.

13. A circuit comprising:
a signal generation circuit;
a first transistor of a first type having a drain, a source, and a gate;
a second transistor of the first type having a drain, a source, and a gate;
a first transistor of a second type having a drain, a source, and a gate; and
a second transistor of the second type having a drain, a source, and a gate,
wherein the circuit is configured to have
the drain of the first transistor of the first type coupled to the source of the second transistor of the first type;
a first voltage value at the source of the first transistor of the first type;
a first control signal at the gate of the first transistor of the first type;
the drain of the second transistor of the first type coupled to the drain of the second transistor of the second type and configured to serve as a wordline;

the gate of the second transistor of the first type coupled to the gate of the second transistor of the second type and configured to have a second voltage value;

the source of the second transistor of the second type coupled to the drain of the first transistor of the second type;

a third voltage value at the source of the first transistor of the second type;

a second control signal at the gate of the first transistor of the second type; and the signal generation circuit generate the first control signal and the second control signal, the first control signal being at the first voltage value when the second control signal is at the second voltage value, the first control signal being at the second voltage value when the second control signal is at the third voltage value, and the second voltage value being unchanged for the first control signal being at the first voltage value and at the second voltage value.

14. The circuit of claim 13, wherein the signal generation circuit comprises:

a first set of one or more transistors of the first type configured to provide the first voltage value to the first control signal;

a first set of one or more transistors of the second type configured to provide the second voltage value to the first control signal;

a second set of one or more transistors of the first type configured to provide the second voltage value to the second control signal; and a second set of one or more transistors of the second type configured to provide the third voltage value to the second control signal.

15. The circuit of claim 14, wherein the first set of one or more transistors of the first type includes a third transistor of the first type having a drain, a source, and a gate;

a fourth transistor of the first type having a drain, a source, and a gate; and a fifth transistor of the first type having a drain, a source, and a gate;

the first set of one or more transistors of the second type includes a third transistor of the second type having a drain, a source, and a gate;

a fourth transistor of the second type having a drain, a source, and a gate; and a fifth transistor of the second type having a drain, a source, and a gate;

the second set of one or more transistors of the first type includes a sixth transistor of the first type having a drain, a source, and a gate;

a seventh transistor of the first type having a drain, a source, and a gate; and an eighth transistor of the first type having a drain, a source, and a gate; and the second set of one or more transistors of the second type includes a sixth transistor of the second type having a drain, a source, and a gate; and a seventh transistor of the second type having a drain, a source, and a gate, wherein the circuit is configured to have the first control signal at the drain of the third transistor of the first type;

the first voltage value at the source of the third transistor of the first type;

the drain of the fourth transistor of the first type coupled to the source of the fifth transistor of the first type;

the first voltage value at the source of the fourth transistor of the first type;

the first control signal at the drain of the fifth transistor of the first type;

the first control signal at the drain of the third transistor of the second type;

the source of the third transistor of the second type coupled to the drain of the fourth transistor of the second type;

the source of the fourth transistor of the second type coupled to the drain of the fifth transistor of the second type;

the third voltage value at the source of the fifth transistor of the second type;

the second control signal at the drain of the sixth transistor of the first type;

the second voltage value at the source of the sixth transistor of the first type;

the drain of the seventh transistor of the first type coupled to the source of the eighth transistor of the first type;

the second voltage value at the source of the seventh transistor of the first type;

the second control signal at the drain of the eighth transistor of the first type;

the second control signal at the drain of the sixth transistor of the second type;

the source of the sixth transistor of the second type coupled to the drain of the seventh transistor of the second type; and the third voltage value at the source of the seventh transistor of the second type.

16. The circuit of claim 15, wherein the signal generation circuit comprises:

an eighth transistor of the second type having a drain, a source, and a gate;

a ninth transistor of the first type having a drain, a source, and a gate; and a ninth transistor of the second type having a drain, a source, and a gate, wherein the signal generation circuit is configured to have the drain of the eighth transistor of the second type coupled to the drain of the fifth transistor of the second type;

the gate of the eighth transistor of the second type receive a gate signal having a pulse width that defines a time for the eighth transistor of the second type to be on;

the drain of the ninth transistor of the second type coupled to the drain of the ninth transistor of the first type; and the second control signal at the source of the ninth transistor of the first type.

17. The circuit of claim 15, wherein the circuit is configured to satisfy at least one of the following conditions:

a gate voltage applied to the gate of the sixth transistor of the second type is shifted compared with a gate voltage applied to the gate of the fourth transistor of the second type; and a gate voltage applied to the gate of the seventh transistor of the second type is shifted compared with a gate voltage applied to the gate of the fifth transistor of the second type.

18. The circuit of claim 14, wherein the circuit is configured to satisfy at least one of the following conditions:
a first assistant control circuit is coupled to the first set of one or more transistors of the second type and is configured to pull down the first control signal; and
a second assistant circuit is configured to have the second control signal and to pull up the second control signal.

19. A circuit comprising:
a signal generation circuit;
a first transistor of a first type having a drain, a source, and a gate;
a second transistor of the first type having a drain, a source, and a gate; and
a first transistor of a second type having a drain, a source, and a gate,
wherein the circuit is configured to have
the drain of the first transistor of the first type coupled to the source of the second transistor of the first type;
a first voltage value at the source of the first transistor of the first type;
a first control signal at the gate of the first transistor of the first type;
the drain of the second transistor of the first type serve as a wordline;
a second voltage value at the gate of the second transistor of the first type;
a third voltage value at the source of the first transistor of the second type;
a second control signal at the gate of the first transistor of the second type;
the signal generation circuit comprising:
at least one third transistor of the first type configured to provide the first voltage value to the first control signal;
at least one second transistor of the second type configured to provide the second voltage value to the first control signal;
at least one fourth transistor of the first type configured to provide the second voltage value to the second control signal; and
at least one third transistor of the second type configured to provide the third voltage value to the second control signal; and
the second voltage value is about half of an operational voltage value of the circuit.

20. The circuit of claim 19, wherein
the first control signal is at the first voltage value when the second control signal is at the second voltage value, and
the first control signal is at the second voltage value when the second control signal is at the third voltage value.

* * * * *